US010768506B2

(12) United States Patent
Chen

(10) Patent No.: US 10,768,506 B2
(45) Date of Patent: Sep. 8, 2020

(54) LIQUID CRYSTAL DISPLAY PANEL AND DISPLAY APPARATUS USING THE SAME

(71) Applicants: HKC Corporation Limited, Shenzhen, Guangdong (CN); Chongqing HKC Optoelectronics Technology Co., Limited, Chongqing (CN)

(72) Inventor: Yu-Jen Chen, Chongqing (CN)

(73) Assignees: HKC Corporation Limited, Shenzhen, Guangdong (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 522 days.

(21) Appl. No.: 15/561,694

(22) PCT Filed: Aug. 15, 2017

(86) PCT No.: PCT/CN2017/097483
§ 371 (c)(1),
(2) Date: Sep. 26, 2017

(87) PCT Pub. No.: WO2019/006823
PCT Pub. Date: Jan. 10, 2019

(65) Prior Publication Data
US 2020/0142275 A1 May 7, 2020

(30) Foreign Application Priority Data
Jul. 7, 2017 (CN) .......................... 2017 1 0552206

(51) Int. Cl.
*G02F 1/29* (2006.01)
*H01L 27/146* (2006.01)
*G02F 1/139* (2006.01)

(52) U.S. Cl.
CPC ................ *G02F 1/29* (2013.01); *G02F 1/139* (2013.01); *H01L 27/14623* (2013.01);
(Continued)

(58) Field of Classification Search
CPC ...... G02F 1/29; G02F 1/139; G02F 2001/294; H01L 27/14623; H01L 27/14625; H01L 27/14649
See application file for complete search history.

(56) References Cited

U.S. PATENT DOCUMENTS 6,040,810 A * 3/2000 Nishimura ........... G09G 3/3648
257/E27.154
6,437,925 B1 * 8/2002 Nishioka ................. G02B 3/14
348/E5.028
(Continued)

FOREIGN PATENT DOCUMENTS

CN      101043535 A    9/2007
CN      102053445 A    5/2011
(Continued)

OTHER PUBLICATIONS

International Search Report dated Mar. 29, 2018, in the corresponding PCT application PCT/CN2017/097483, 10 pages in Chinese.

*Primary Examiner* — Michael J Jansen, II
(74) *Attorney, Agent, or Firm* — Juan Carlos A. Marquez; Marquez IP Law Office, PLLC

(57) ABSTRACT

The present invention provides a display panel and its application, the display panel comprises a first substrate, a second substrate, a liquid crystal layer disposed between the first substrate and the second substrate, an image sensing module disposed on the second substrate facing to a side of the first substrate, a driving module disposed on the second substrate facing to the side of the first substrate for driving a plurality of liquid crystal molecules distributed in the liquid crystal layer. Wherein, the liquid crystal molecules disposing between the image sensing module and the first substrate is configured to form a liquid crystal lens in response to a vertical electric field between the first and second substrates. The image sensing module is configured
(Continued)

for receiving the image light focused by the liquid crystal lens.

20 Claims, 9 Drawing Sheets

(52) U.S. Cl.
CPC .. *H01L 27/14625* (2013.01); *H01L 27/14649* (2013.01); *G02F 2001/294* (2013.01)

(56) References Cited

U.S. PATENT DOCUMENTS

| | | | | |
|---|---|---|---|---|
| 6,865,009 | B2* | 3/2005 | Nishioka | G02B 3/14 |
| | | | | 348/E5.028 |
| 7,535,468 | B2* | 5/2009 | Uy | H01L 27/14601 |
| | | | | 345/104 |
| 8,520,153 | B2* | 8/2013 | Kao | G02B 3/14 |
| | | | | 349/7 |
| 8,629,932 | B2* | 1/2014 | Galstian | H04N 5/2254 |
| | | | | 348/349 |
| 9,684,101 | B2* | 6/2017 | Chin | G02B 3/0081 |
| 9,772,500 | B2* | 9/2017 | Wu | G02F 1/13306 |
| 10,225,458 | B2* | 3/2019 | Cho | H04N 5/232125 |
| 10,520,778 | B2* | 12/2019 | Chen | G02F 1/29 |
| 2004/0179280 | A1* | 9/2004 | Nishioka | G02B 17/0832 |
| | | | | 359/846 |
| 2006/0007222 | A1* | 1/2006 | Uy | H01L 27/14603 |
| | | | | 345/207 |
| 2010/0039532 | A1* | 2/2010 | Galstian | H04N 5/2254 |
| | | | | 348/231.99 |
| 2011/0085094 | A1* | 4/2011 | Kao | G02B 30/27 |
| | | | | 349/5 |
| 2011/0205342 | A1* | 8/2011 | Lin | H04N 13/359 |
| | | | | 348/54 |
| 2013/0215340 | A1 | 8/2013 | Su et al. | |
| 2015/0185488 | A1* | 7/2015 | Wu | G02F 1/13471 |
| | | | | 349/15 |
| 2015/0260884 | A1* | 9/2015 | Chin | G02F 1/29 |
| | | | | 349/200 |
| 2018/0373101 | A1* | 12/2018 | Chen | G02B 30/27 |
| 2019/0014266 | A1* | 1/2019 | Cho | H04N 5/2257 |
| 2019/0391458 | A1* | 12/2019 | Chen | G02F 1/29 |

FOREIGN PATENT DOCUMENTS

| | | |
|---|---|---|
| CN | 102854737 A | 1/2013 |
| CN | 105208255 A | 12/2015 |
| TW | M326702 U | 2/2008 |

\* cited by examiner

LIQUID CRYSTAL DISPLAY PANEL AND DISPLAY APPARATUS USING THE SAME

FIELD OF THE INVENTION

The present invention relates to a display panel and its applications, and more particularly to a display panel and its applications not limited by the depth of field and have variable focus.

BACKGROUND OF THE INVENTION

Depth of Field refers to the range of appearance of image sharpness in focusing by the image sensing device. In the optical, especially the video or photography, the depth of field is a description of distance for the object having sharp focus in the space. General lens can only focus the light to a fixed distance and away from this distance the sharpness is gradual decrease, but the unsharpness is imperceptible under certain distance, i.e. so called the depth of field. To eliminate the limitations of the depth of field, the image sensing component requires a variable focus function.

In the present LCD display panel manufacturing industry, the image sensing module and display panel were combined to form a multi-function display to achieve both the purpose of image scanning and displaying. The image scanning functions such as computer cameras and computer eyes. The multi-function display used as a video input devices are widely used in video conferencing, telemedicine, real-time monitoring and so on. In recent years, the network speed continuously increasing accompanied with the development of Internet technology and the techniques of the component using in sensing the object into the image is mature and widely used in the manufacture of the multi-function display, therefore the two ends can communicate with each other with image, video, voice conversation and communication through the video input devices in the network. Furthermore, the multi-function display plays an increasingly important role in people's lives and work since it can also be used for processing the current various popular digital imaging, audio and video. However, the image sensing module used in the multi-function display has a fixed focal length range, so its imaging sharpness is limited by the depth of field and with poor performance.

In addition, the traditional glass or plastic lens is only a single focal length, and no variable focusing function. It would be desirable to provide zoom lenses with variable focusing as the name implies more than two traditional lens combination and employs a voice coil motor (VCM) or piezoelectric actuator to change the relative distances between the zoom lenses to obtain variation and magnification of focusing. However, for the traditional autofocus zoom lenses module the volume of the voice coil motor been a trouble in oversize and resulting the difficulties in application.

SUMMARY OF THE INVENTION

In order to solve the aforementioned problem, it is an object of the present invention to provide a display panel and its applications, and more particularly to a display panel and its applications not limited by the depth of field and have variable focusing to meet the requirements of thin and light in present various devices and raising the usability.

For solving aforementioned technical problem, the present invention utilizes the properties of the liquid crystal material in its birefringence and the liquid crystal molecules tilting with the electric field to equivalent the function of variable focusing to the graded refractive index (GRIN) of the special optical lens, and by adjusting driving voltage of liquid crystal molecules to vary the equivalent refractive index of liquid crystal lens. The refractive index will be alter by the driving voltage and the focus varying accordingly, therefore the liquid crystal material is very suitable for making a variable focusing lens module.

Therefore, employing the new technique of the liquid crystal lens in the autofocusing technology it can easily solve the problem of the volume of the focusing device. The thin film transistor LCD panel contains a liquid crystal material inherently and the manufacturing of the liquid crystal lens is simple so that the main volume completely from the glass thickness and to achieve autofocusing without the distance for movement of the lens. Therefore the image sensing module is combined with the liquid crystal lens to vary the focus can also solve the problem of the related art.

The purpose of the present invention and the technical problem to be solved can be further realized by the following technical embodiments.

It is an object of the present invention to provide a display panel, comprising a first substrate, a second substrate, a liquid crystal layer disposed between the first substrate and the second substrate and a plurality of liquid crystal molecules distributed uniformly in the liquid crystal layer, an image sensing module disposed on the second substrate facing to a side of the first substrate, and a driving module, such as active switch array module, disposed on the second substrate facing to the side of the first substrate and configured for driving a plurality of liquid crystal molecules distributed in the liquid crystal layer. Wherein, the liquid crystal molecules is disposed between the image sensing module and the first substrate. A vertical electric field is formed between the first substrate and the second substrate and drives the liquid crystal molecules to form a liquid crystal lens. The image sensing module is configured to receive the image light been focused by the liquid crystal lens. The liquid crystal lens is configured to adjust the focus of the image sensing module.

In one embodiment of the present invention, an image sensing module is arranged in parallel with a driving module such as active switch array module.

In one embodiment of the present invention, an image sensing module includes an optical sensor.

In one embodiment of the present invention, the optical sensor is a phototransistor.

In one embodiment of the present invention, the energy band gap of the optical sensor material is less than 1.12 eV, and the materials maybe a narrow bandgap organic or a narrow bandgap inorganic such as amorphous silicon, microcrystalline silicon, polysilicon or mercury cadmium telluride semiconductor materials.

In one embodiment of the present invention, a light shielding region is disposed between a first substrate and a liquid crystal lens, and the light shielding region includes a material its blocking visible light but transmitting an infrared light.

In one embodiment of the present invention, a driving electrode is disposed on the first substrate facing to the second substrate and corresponding to the location of the liquid crystal lens and is configured to tilt the liquid crystal molecules, and the driving electrode is configured to change the vertical electric field between the first substrate and the second substrate.

The purpose of the present invention and the technical problem to be solved can be further realized by the following technical embodiments.

Another object of the present invention is to provide an image sensing display apparatus comprising a direct type or an edge type backlight module, a controller and a display panel. The display panel comprises a first substrate, a second substrate, a liquid crystal layer disposed between the first substrate and the second substrate, an image sensing module disposed on the second substrate facing to a side of the first substrate, a driving module disposed on the second substrate facing to the side of the first substrate and configured for driving a plurality of liquid crystal molecules distributed in the liquid crystal layer. Wherein, the liquid crystal molecules is disposed between the image sensing module and the first substrate, and a vertical electric field is formed between the first substrate and the second substrate and is configured to drive the liquid crystal molecules to form a liquid crystal lens. The image sensing module is configured to receive the image light focused by the liquid crystal lens. The liquid crystal lens is configured to adjust the focus of the image sensing module.

In one embodiment of the present invention, an image sensing module is arranged in parallel with a driving module.

In one embodiment of the present invention, an image sensing module includes an optical sensor.

In one embodiment of the present invention, the optical sensor is a photodiode.

In one embodiment of the present invention, the optical sensor is a phototransistor.

In one embodiment of the present invention, the energy band gap of the optical sensor material is less than 1.12 eV, and the materials maybe a narrow bandgap organic or a narrow bandgap inorganic.

In one embodiment of the present invention, a light shielding region is disposed between a first substrate and a liquid crystal lens.

In one embodiment of the present invention, the light shielding region is configured to transmit an infrared light.

In one embodiment of the present invention, a driving electrode is disposed on the first substrate facing to the second substrate and corresponding to the location of the liquid crystal lens and is configured to tilt the liquid crystal molecules, and the driving electrode is configured to change the vertical electric field between the first substrate and the second substrate.

The present invention provide another display panel comprises a first substrate, a second substrate, a liquid crystal layer disposed between the first substrate and the second substrate and includes a plurality of liquid crystal molecules distributed, an image sensing module disposed on the second substrate facing to a side of the first substrate and includes an optical sensor, a driving module disposed on the second substrate facing to the side of the first substrate and in parallel with the image sensing module. The driving module is configured to drive the liquid crystal molecules distributed in the liquid crystal layer. Wherein, a light shielding region is disposed on the first substrate facing to the second substrate and is configured to transmit an infrared light. The liquid crystal molecules is disposed between the image sensing module and the first substrate. A vertical electric field is formed between the first substrate and the second substrate and drives the liquid crystal molecules to form a liquid crystal lens. The image sensing module is configured to receive the image light focused by the liquid crystal lens. The liquid crystal lens is configured to adjust the focus of the image sensing module.

After the improvement of the present invention, the portion of the liquid crystal inside the TFT liquid crystal display panel and located at one side of the image sensing module facing to the first substrate are functional changed into liquid crystal lens, the combination of the image sensing module and the liquid crystal lens it can achieve the function of variable focus so that the object imaging is not limited by the depth of field and effectively overcome the aforementioned problems in the related application. Furthermore, this combining device can be used to realize the function of image recognition and vein sensing.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1A:
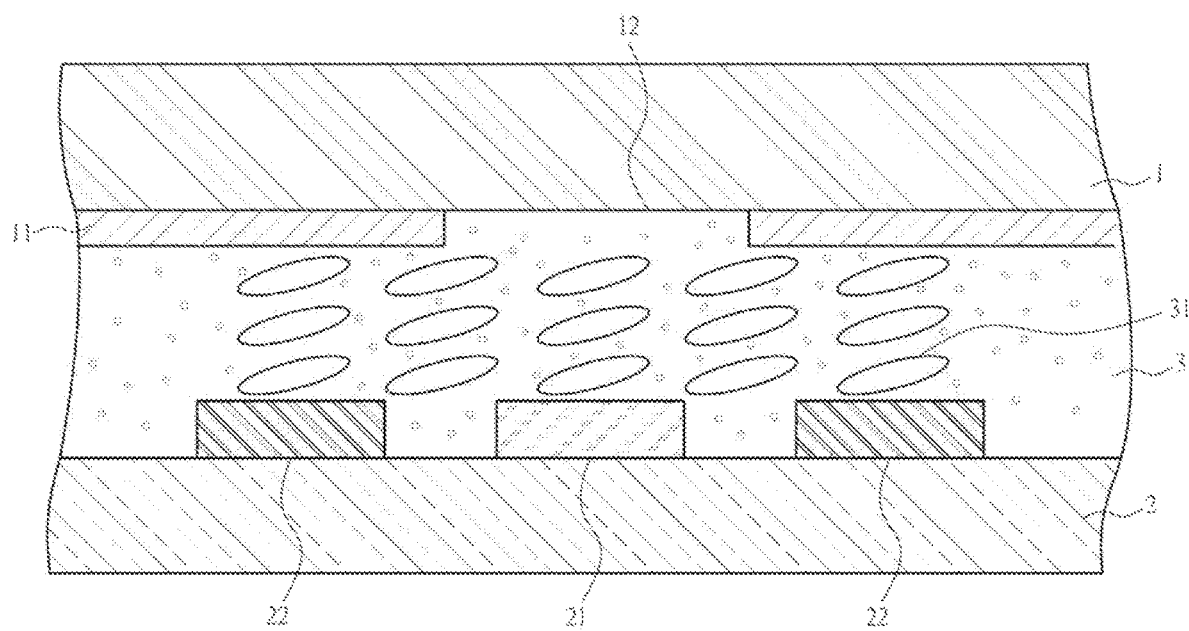
FIG. 1A is a schematic view of a display panel having a variable focus according to an embodiment of the present application.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

Furthermore, in the specification, "on" implies being positioned above or below a target element and does not imply being necessarily positioned on the top on the basis of a gravity direction.

The main principle of the Liquid Crystal Display (LCD) is an electric field employ to the liquid crystal for displaying the numbers or images, wherein the liquid crystal consists of a substance between the liquid and the solid. The image is formed by controlling the light transmission of the liquid crystal display panel, wherein the liquid crystal is uniformly disposed in the liquid crystal display panel.

FIG. 1A is a schematic view of a display panel having a variable focus according to an embodiment of the present application. Referring to FIG. 1A, in an embodiment of the present application, the display panel comprises a first substrate 1, a second substrate 2, a liquid crystal layer 3 disposed between the first substrate 1 and the second substrate 2 and comprises a plurality of liquid crystal molecules 31 distributed uniformly, an image sensing module 22 disposed on the second substrate 2 facing to a side of the first substrate 1, an active switch array module 21 disposed on the second substrate 2 facing to the side of the first substrate 1 and configured for driving the liquid crystal molecules 31 distributed uniformity in the liquid crystal layer 3. Wherein, the liquid crystal molecules 31 disposing between the image sensing module 22 and the first substrate 1 is configured to form a liquid crystal lens in response to a vertical electric field between the first substrate 1 and the second substrate 2.

In the aforementioned embodiment, the image sensing module 22 is disposed in parallel with the active switch array module 21, the liquid crystal molecules 31 distributing uniformly in the liquid crystal layer 3 where it corresponds to the location of the image sensing module 22 is formed into a liquid crystal lens. In one embodiment of the present invention, a driving electrode is disposed on the first substrate 1 facing to the second substrate 2 and corresponding to the location of the liquid crystal lens and is configured to tilt the liquid crystal molecules 31, the driving electrode is configured to change the vertical electric field between the first substrate 1 and the second substrate 2. The liquid crystal lens has lens refraction consequence by adjusting the electric field to the driving electrode to tilt the liquid crystal molecules in different angles, so as to obtain different focal lengths and the image light of the tuned focal length may be focused to the image sensing module 22.

Furthermore, on the side of the first substrate 1 facing the second substrate 2 there is a transmitting region for displaying an image and further includes a light shielding region 11 arranged in both side of transmitting region. The material used in the light shielding region 11 only allows a specific band of light wavelength to transmit, such as infrared light. For example, in one exemplary embodiment, a light shielding region 11 is disposed between the first substrate 1 and the liquid crystal lens and the material thereof is used to effectively block the visible light but allowing only infrared light passing through.

In one of the aforementioned problem to be solved is the individual optical component has only single focal length, so that the sharpness of the image of the object is limited by the depth of field. In order to overcome this drawback, the present invention utilizes the electric field under the light shielding region 11 to control the rotation of the liquid crystal molecules 31, and employ the properties and characteristics of the liquid crystal molecules 31 to formed the liquid crystal lens to refractive light and further combined with the image sensing module 22 locating on the one side of the second substrate 2 to form into a variable focusing image sensing unit, so that to improve the image quality and not limited by the depth of field.

The liquid crystal lens of the present embodiment can be produced together with the manufacturing process of the conventional display panel, no need for an additional complicated process step or an additional volume, to achieve the function of autofocusing without the need to reserve the space for lens moving in conventional device. Therefore, the image sensing module combined with the liquid crystal lens can be used to vary the focus and the problem of depth of field to be overcome in this invention can be effectively solved.

Namely, the display panel employing function of variable focusing of the present invention comprises a first substrate 1, a second substrate 1, an active switch array module 21 and an image sensing module 22. For ease of explanation, only single thin film transistor of active switch array module 21 and single image sensing module are shown in FIG. 1A. This is not limited to the active switch array module 21 and an image sensing module can only individually have a single component.

Figure 1B:
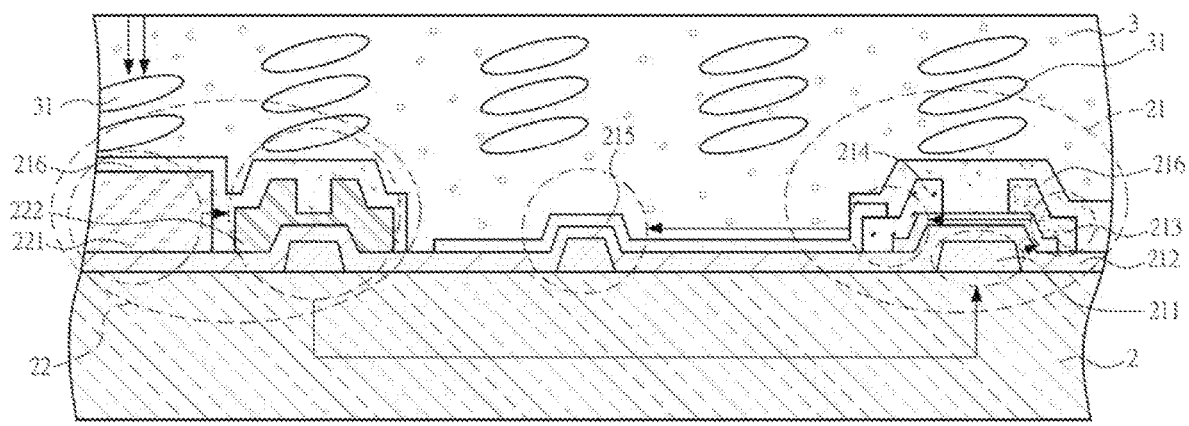
FIG. 1B is a schematic diagram of converting an image light sensing into an electrical signal according to an embodiment of the present invention.

Further referring to FIG. 1B, FIG. 1B is a schematic diagram of converting an image light sensing into an electrical signal according to an embodiment of the present invention. The image sensing display panel structure shown in the FIG. 1B includes a second substrate 2 and an active switch array module 21 and an image sensing module 22 disposed thereon. A driving electrode is disposed on the first substrate facing to the second substrate and corresponding to the location of the liquid crystal lens and is configured to tilt the liquid crystal molecules, the driving electrode is pixel electrode 215 in the present embodiment. The image sensing module 22 is disposed on the one side of the second substrate facing to the first substrate 1, the image sensing module 22 has an optical sensor 221 capable of receiving the image light after focusing by the liquid crystal lens and converting it into a current. Then, the current flowing to the side of the photoelectric switch 222 to form an electrical signal and transmits it to the active switch array module 21 to control the liquid crystal molecules 31 in the liquid crystal layer 3 to generate an image. The active switch array module 21 has a gate switch 211 to receive an electrical signal transmitted by the photoelectric switch 221, therefore controlling the current of liquid crystal driving voltage flows from the source electrode 213 to the drain electrode 214 and then transferring to the pixel electrode 215 and the first substrate 1 shown in FIG. 1A to form an electric field to control the rotation of the liquid crystal molecules 31 in the liquid crystal layer 3. In therebetween, one side of the gate switch 211 facing to the first substrate 1 is provided with an electrically insulating protective layer 212, and also a protective layer 216 is disposed on the side with active switch array module 21 and the image sensing module 22 facing to the first substrate 1 to isolate the liquid crystal molecules.

In this embodiment, the image sensing module 22 includes an optical sensor 221, the optical sensor 221 may be the photodiode or phototransistors, the material of optical sensor may be selected from a narrow bandgap organic and inorganic materials and the energy band gap of the material is less than 1.12 eV, such as phototube composite of amorphous silicon, microcrystalline silicon, polysilicon or mercury cadmium telluride (HgCdTe) semiconductor materials.

Figure 1C:
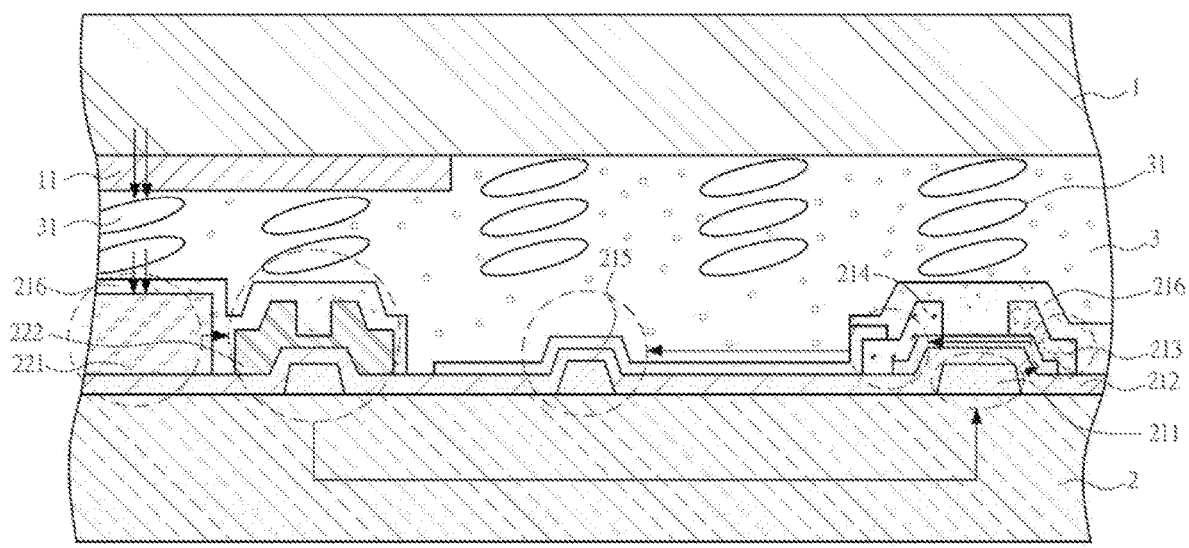
FIG. 1C is a schematic diagram of converting image light sensing into an electrical signal according to another embodiment of the present invention.

Referring to FIG. 1C, FIG. 1C is a schematic diagram of converting image light sensing into an electrical signal according to another embodiment of the present invention. In the embodiment as shown in FIG. 1C, the first substrate 1 of the image sensing display panel is provided with a transmitting region 12 as shown in FIG. 1A and a light shielding region 11 allowing only specific light wavelength passing through.

The image sensing display panel structure shown in the FIG. 1C includes a first substrate 1 has a transmitting region 12 (as shown in FIG. 1A) and a light shielding region 11 allowing only specific light wavelength (such as infrared light) passing through, and a second substrate 2 has one side facing to the first substrate 1 is disposed with an active switch array module 21 and an image sensing module 22 thereon (as shown in FIG. 1B). The image sensing module 22 is disposed on the second substrate 2 facing to the first substrate 1 and corresponding to the location of the light shielding region 11, the image sensing module 22 has an optical sensor 221 capable of receiving an infrared light derived from the ambient visible light transmitting through the light shielding region 11 and refracted by the liquid crystal lens, and then transforming into the current. Then, the current flowing to the side of the photoelectric switch 222 to form an electrical signal and transmits it to the active switch array module 21 (as shown in FIG. 1B) to control the liquid crystal molecules 31 in the liquid crystal layer 3 to generate an image. In practice, the liquid crystal molecules 31 can be filled between the first substrate 1 (the color film substrate) and the second substrate 2 (the active switch array substrate) by the TFT-IXD (thin film transistor liquid crystal display) technology to form to "flat type" liquid crystal lens. It utilizes the properties of the liquid crystal molecules in its birefringence and tilting with the electric field to make the light focusing or diverging to resemble the optical effect similar to the lens (plastic or glass lens).

In above embodiment, the optical sensor 221 may be the photodiode or phototransistors, the material of optical sensor may be selected from a narrow bandgap organic and inorganic materials and the energy band gap of the material is less than 1.12 eV, such as phototube composite of amorphous silicon, microcrystalline silicon, polysilicon or mercury cadmium telluride (HgCdTe) semiconductor materials. Since the optical sensor 221 of the present embodiment mainly absorbs the infrared light to induce the current, therefore a light shielding region allowing only infrared light passing through is disposed in this embodiment as shown in the FIG. 1A. Based on the arrangement of the light shielding region 11, the image light to be received by the image sensing module 22 it can passing through light shielding region 11 and then focusing by the liquid crystal lens and isolating from the external ambient light or backlight interference, so that the sensitivity of the image sensing module 22 will not be affected.

Therefore as shown in FIG. 1C, in the aforementioned embodiment, the active switch array module 21 has a gate switch 211 to receive an electrical signal transmitted from the photoelectric switch 221 it transforming the received infrared light, therefore controlling the current of liquid crystal driving voltage flows from the source electrode 213 to the drain electrode 214 and then transferring to the pixel electrode 215 and the first substrate 1 shown in FIG. 1A to form an electric field to control the rotation of the liquid crystal molecules 31 in the liquid crystal layer 3. In therebetween, one side of the gate switch 211 facing to the first substrate 1 is provided with an electrically insulating protective layer 212, and also a protective layer 216 is disposed on the side with active switch array module 21 and the image sensing module 22 facing to the first substrate 1 to isolate the liquid crystal molecules.

That is, the present invention utilizes the properties of the liquid crystal material in its birefringence and the liquid crystal molecules tilting with the electric field to equivalent the function of variable focusing to the graded refractive index (GRIN) of the special optical lens, and by adjusting driving voltage of liquid crystal molecules to vary the equivalent refractive index of liquid crystal lens. The refractive index will be alter by the driving voltage and the focus varying accordingly, therefore the liquid crystal material is very suitable for making a variable focusing lens module. Comparing with the present lens the liquid crystal lens has the following advantages: 1. Only the digital technology to be employing in the present lens to enlarge portion of the photo to realize "zoom" visual effects therefore it can not realize the real optical zoom, however the liquid crystal lens can be by applying different voltages to change the orientation of the liquid crystal molecules to achieve the effect on physical variable focus, it can achieve optical zoom result effectively in a small space and the feature in light and thin is a major advantage. 2. The present lenses have obvious outward appearance and it is detrimental protection of confidential information, however the "flat type" liquid crystal lens employing the properties of the liquid crystal molecules has no difference in the exterior comparing with the liquid crystal panel and has strong obscuration.

Therefore, employing the new technique of the liquid crystal lens in the autofocusing technology it can easily solve the problem of the volume of the focusing device. The thin film transistor LCD panel contains a liquid crystal material inherently and the manufacturing of the liquid crystal lens is simple so that the main volume completely from the glass thickness and to achieve autofocusing without the distance for movement of the lens. Therefore, the image sensing module combined with the liquid crystal lens to vary the focus can also solve the problem of the related art.

After the improvement of the present invention, the portion of the liquid crystal inside the TFT liquid crystal display panel and located at one side of the image sensing module 22 facing to the first substrate are functional changed into liquid crystal lens, the combination of the image sensing module 22 and the liquid crystal lens it can achieve the function of variable focus so that the object imaging is not limited by the depth of field and effectively overcome the aforementioned problems in the related application. Furthermore, this combining device can be used to realize the function of image recognition and vein sensing.

In addition, another object of the present invention is to provide an image sensing display apparatus, the structure of the image sensing display apparatus employing the aforementioned panel and combine with the backlight module, for example includes a direct type or an edge type backlight module, and further includes the image sensing display panel.

Figure 2A:
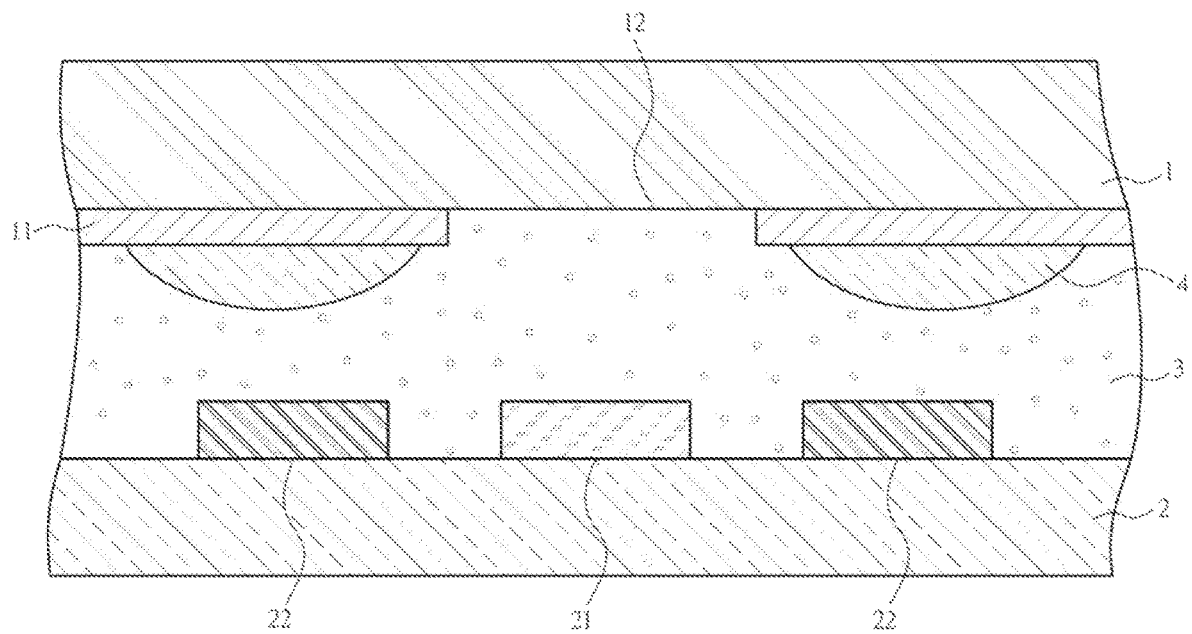
FIG. 2A is a schematic view of a display panel having a variable focus according to an embodiment of the present application.
Figure 2B:
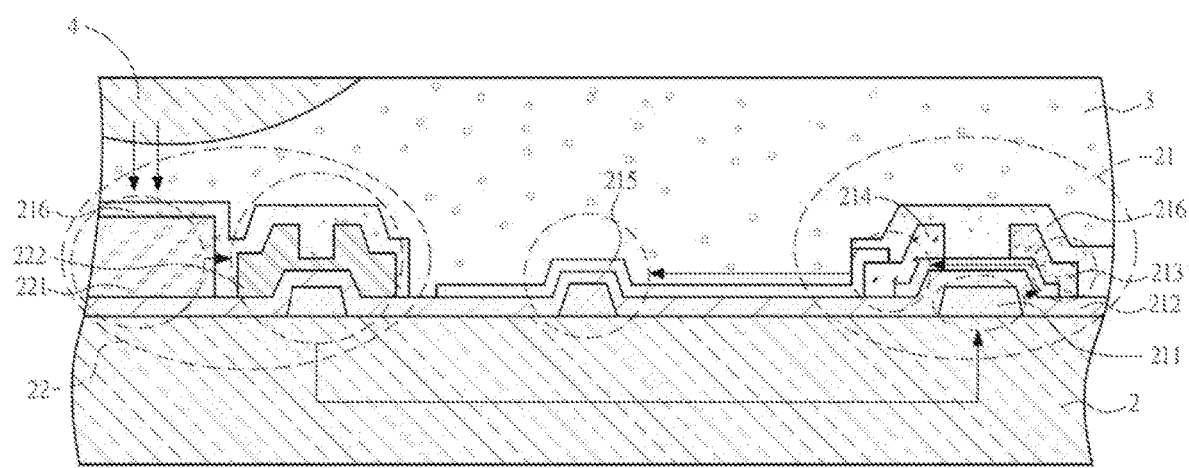
FIG. 2B is a schematic diagram of converting an image light sensing into an electrical signal according to an embodiment of the present invention.
Figure 2C:
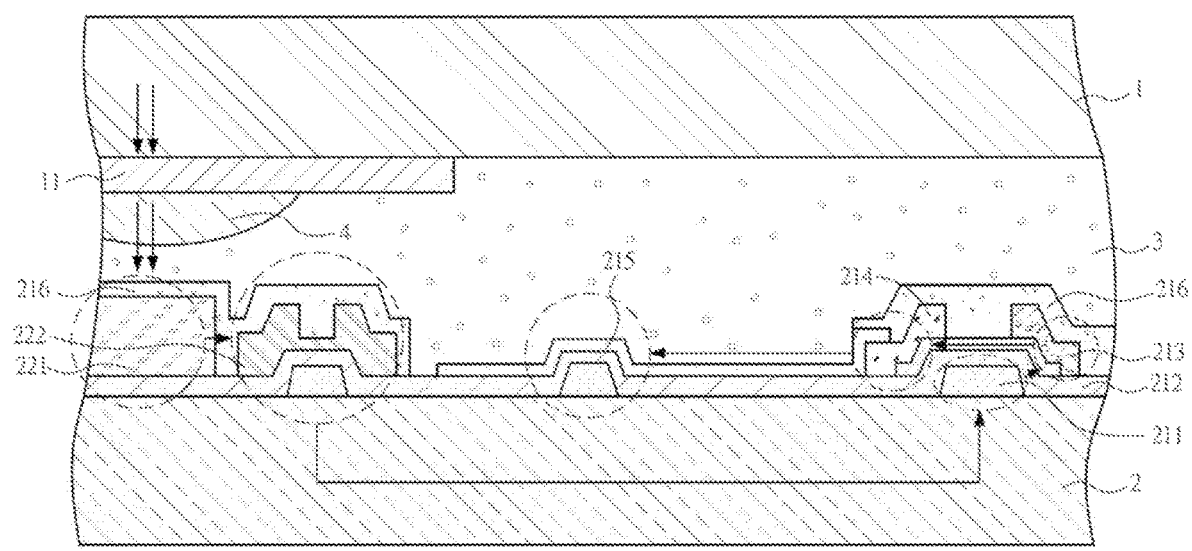
FIG. 2C is a schematic diagram of converting image light sensing into an electrical signal according to another embodiment of the present invention.

Through the combination of the lens module and the image sensing module to achieve the function of variable focus can be as shown in the FIGS. 2A, 2B and 2C, the lens module 4 is disposed on one side of the first substrate 1 facing to the second substrate 2 and corresponding to the location of the image sensing module 22, the image light been focused by the lens module 4 and imaged on the image sensing module 22. As shown in FIG. 2B, the image sensing module 22 has an optical sensor 221 capable of receiving the image light been focused by the lens module 4 and transforming it into the current. Then, the current flowing to the side of the photoelectric switch 222 to form an electrical signal and transmits it to the active switch array module 21 to control the liquid crystal layer 3 to generate an image. The active switch array module 21 has a gate switch 211 to receive an electrical signal transmitted by the photoelectric switch 221, therefore controlling the current of liquid crystal driving voltage flows from the source electrode 213 to the drain electrode 214 and then transferring to the pixel electrode 215 and the first substrate 1 shown in FIG. 2A to form an electric field to control the rotation of the liquid crystal molecules 31 in the liquid crystal layer 3. In therebetween, one side of the gate switch 211 facing to the first substrate 1 is provided with an electrically insulating protective layer 212, and also a protective layer 216 is disposed on the side with active switch array module 21 and the image sensing module 22 facing to the first substrate 1 to isolate the liquid crystal molecules. As shown in FIG. 2C, a light shielding region 11 is disposed between the first substrate 1 and the lens module 4 to screen and isolate the specific light wavelength.

Figure 3A:
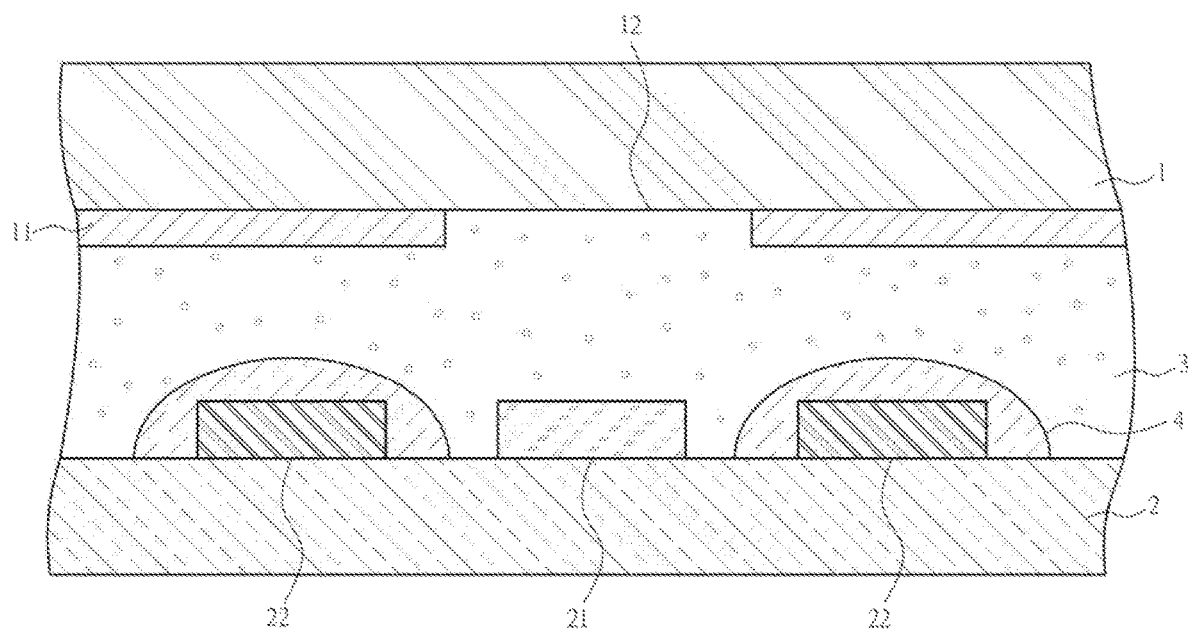
FIG. 3A is a schematic view of a display panel having a variable focus according to an embodiment of the present application.
Figure 3B:
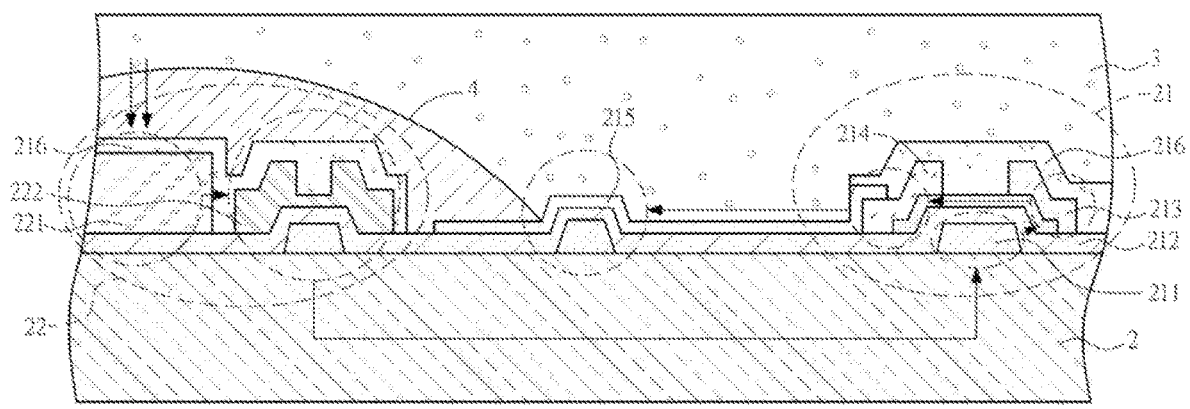
FIG. 3B is a schematic diagram of converting an image light sensing into an electrical signal according to an embodiment of the present invention.
Figure 3C:
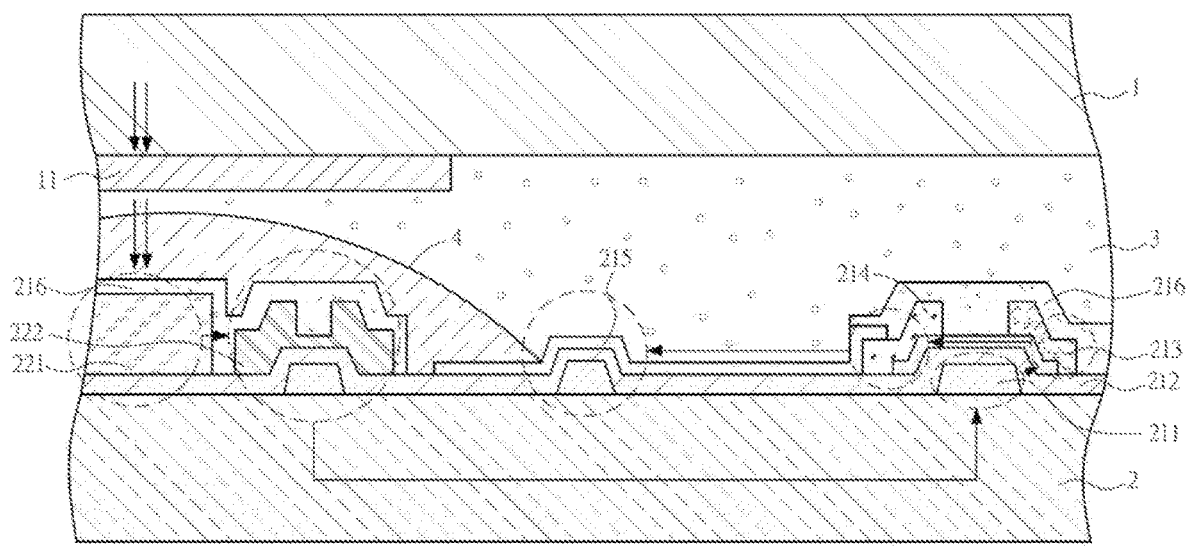
FIG. 3C is a schematic diagram of converting image light sensing into an electrical signal according to another embodiment of the present invention.

In an embodiment it might be as shown in FIGS. 3A, 3B and 3C, the lens module 4 is disposed on one side of the second substrate 2 where the image sensing module 22 located and facing to the first substrate 1, the image light been focused by the lens module 4 and imaged on the image sensing module 22. As shown in FIG. 3B the image sensing module 22 has an optical sensor 221 capable of receiving the image light been focused by the lens module 4 and transforming it into the current. Then, the current flowing to the side of the photoelectric switch 222 to form an electrical signal and transmits it to the active switch array module 21 to control the liquid crystal layer 3 to generate an image. The active switch array module 21 has a gate switch 211 to receive an electrical signal transmitted by the photoelectric switch 221, therefore controlling the current of liquid crystal driving voltage flows from the source electrode 213 to the drain electrode 214 and then transferring to the pixel electrode 215 and the first substrate 1 shown in FIG. 2A to form an electric field to control the rotation of the liquid crystal molecules 31 in the liquid crystal layer 3. In therebetween, one side of the gate switch 211 facing to the first substrate 1 is provided with an electrically insulating protective layer 212, and also a protective layer 216 is disposed above the side with active switch array module 21 and the image sensing module 22 to isolate the liquid crystal molecules. As shown in FIG. 3C, a light shielding region 11 is disposed between the first substrate 1 and the lens module 4 to screen and isolate the specific light wavelength. In additional, in practice, the circuitry can also be formed on the array substrate to realize the image sensing module 22, even CPU, RAM, Flash, DSP compression coding processor and imaging sensor. It is to be noted that when a circuit for realizing the above-described function is directly formed on the second substrate, it is possible to synchronize it with the array substrate of the liquid crystal panel by the photolithography process such as exposure with the mask and developing. Wherein the second substrate may be, but is not limited to, a monocrystalline substrate, a low temperature polysilicon substrate, a high temperature polysilicon substrate, or other substrate capable of satisfying a high mobility of the peripheral integrated circuit.

Referring to the FIGS. 1A, 1B 1C, 2A, 2B, 2C, 3A, 3B, and 3C, in an embodiment, a display apparatus includes a direct type or an edge type backlight module, a controller, and further includes display panel described in the respective embodiments. Wherein, the display apparatus may employing the liquid crystal display panel selected from the following modes: Twisted Nematic (TN), Super Twisted Nematic (STN), Optically Compensated Birefringence (OCB), Vertical Alignment (VA), curved, but not limited thereto. In the embodiments of the present invention, the relevant lens is formed on or attached to the substrate of the display panel (e.g., a lens module) or distributed on an inner liquid crystal layer (e.g., a liquid crystal lens), there is no need to occupy the peripheral area of the display panel, simultaneously, the display apparatus has stronger image capture capability due to equip the "flat" lens with physical variable focus.

In addition, in the specification, unless explicitly described to the contrary, the word "comprise" and variations such as "comprises" or "comprising" will be understood to imply the inclusion of stated elements but not the exclusion of any other elements.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A display panel, comprising:
a first substrate;
a second substrate;
a liquid crystal layer, disposed between the first substrate and the second substrate;
an image sensing module, disposed on the second substrate facing a side of the first substrate; and
a driving module, disposed on the second substrate facing the side of the first substrate for driving a plurality of liquid crystal molecules distributed in the liquid crystal layer;
wherein, the plurality of liquid crystal molecules are disposed between the image sensing module and the first substrate, a vertical electric field is formed between the first substrate and the second substrate and drives the plurality of liquid crystal molecules to form a liquid crystal lens, the image sensing module is configured to receive the image light focused by the liquid crystal lens, and the liquid crystal lens is configured to adjust the focus of the image sensing module.

2. The display panel according to claim 1, wherein the image sensing module is arranged in parallel with the driving module.

3. The display panel according to claim 1, wherein the image sensing module comprises an optical sensor.

4. The display panel according to claim 3, wherein the optical sensor is photodiode.

5. The display panel according to claim 3, wherein the optical sensor is phototransistors.

6. The display panel according to claim 3, wherein the optical sensor comprises a material selected from a narrow bandgap organic and inorganic materials, and the energy band gap of the material is less than 1.12 eV.

7. The display panel according to claim 1, further comprising a light shielding region disposed between the first substrate and the liquid crystal lens.

8. The display panel according to claim 7, wherein the light shielding region is configured to transmit an infrared light.

9. The display panel according to claim 1, further comprising a driving electrode disposed on the first substrate facing to the second substrate and corresponding to the location of the liquid crystal lens, and configured to tilt the liquid crystal molecules.

10. The display panel according to claim 9, wherein the driving electrode is configured to change the vertical electric field formed between the first substrate and the second substrate.

11. A display apparatus comprising a backlight module, a controller and a display panel, the display panel comprising:
- a first substrate;
- a second substrate;
- a liquid crystal layer, disposed between the first substrate and the second substrate;
- an image sensing module, disposed on the second substrate facing a side of the first substrate; and
- a driving module, disposed on the second substrate facing the side of the first substrate for driving a plurality of liquid crystal molecules distributed in the liquid crystal layer;
- wherein, the plurality of liquid crystal molecules are disposed between the image sensing module and the first substrate, a vertical electric field is formed between the first substrate and the second substrate and drives the plurality of liquid crystal molecules to form a liquid crystal lens, the image sensing module is configured to receive the image light focused by the liquid crystal lens, and the liquid crystal lens configured for adjusting the focus of the image sensing module.

12. The display apparatus according to claim 11, wherein the image sensing module is arranged in parallel with the driving module.

13. The display apparatus according to claim 11, wherein the image sensing module comprises an optical sensor.

14. The display apparatus according to claim 13, wherein the optical sensor is photodiode.

15. The display apparatus according to claim 13, wherein the optical sensor is phototransistors.

16. The display apparatus according to claim 13, wherein the optical sensor comprises a material selected from a narrow bandgap organic and inorganic materials, and the energy band gap of the material is less than 1.12 eV.

17. The display apparatus according to claim 11, further comprising a light shielding region disposed between the first substrate and the liquid crystal lens.

18. The display apparatus according to claim 17, wherein the light shielding region is configured to transmit an infrared light.

19. The display apparatus according to claim 11, further comprising a driving electrode disposed on the first substrate facing to the second substrate and corresponding to the location of the liquid crystal lens and configured to tilt the liquid crystal molecules, the driving electrode configured to change the vertical electric field between the first substrate and the second substrate.

20. A display panel, comprising:
- a first substrate;
- a second substrate;
- a liquid crystal layer, disposed between the first substrate and the second substrate and, having a plurality of liquid crystal molecules distributed;
- an image sensing module, disposed on the second substrate facing a side of the first substrate, having an optical sensor; and
- a driving module, disposed on the second substrate facing the side of the first substrate and in parallel with the image sensing module, for driving the plurality of liquid crystal molecules distributed in the liquid crystal layer;
- wherein, a light shielding region is configured to transmit an infrared light disposed on the first substrate facing to the second substrate, the plurality of liquid crystal molecules are disposed between the image sensing module and the first substrate, a vertical electric field is formed between the first substrate and the second substrate and drives the plurality of liquid crystal molecules to form a liquid crystal lens, the image sensing module is configured to receive the image light focused by the liquid crystal lens, and the liquid crystal lens is configured to adjust the focus of the image sensing module.

* * * * *